United States Patent
Hirschberg et al.

(10) Patent No.: US 6,294,725 B1
(45) Date of Patent: Sep. 25, 2001

(54) WIRELESS SOLAR CELL ARRAY ELECTRICAL INTERCONNECTION SCHEME

(75) Inventors: Alan M. Hirschberg, Thousand Oaks; Dean Tran, Westminster; David M. Carberry, Redondo Beach, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/540,735

(22) Filed: Mar. 31, 2000

(51) Int. Cl.[7] .................................................. H01L 31/042
(52) U.S. Cl. ..................... 136/256; 136/244; 136/251; 136/293; 438/80; 438/66; 438/67; 438/98
(58) Field of Search ............................ 136/244, 251, 136/256, 293; 438/80, 66, 67, 98

(56) References Cited

U.S. PATENT DOCUMENTS

| | | | |
|---|---|---|---|
| 4,084,985 | * | 4/1978 | Evans, Jr. ........................ 136/251 |
| 4,240,842 | | 12/1980 | Lindmayer et al. . |
| 4,348,254 | | 9/1982 | Lindmayer et al. . |
| 4,392,010 | | 7/1983 | Lindmayer et al. . |
| 4,562,637 | * | 1/1986 | Kushima et al. ................... 136/251 |
| 4,892,592 | | 1/1990 | Dickson et al. . |
| 5,006,179 | | 4/1991 | Gaddy et al. . |
| 5,011,544 | | 4/1991 | Gaddy et al. . |
| 5,021,099 | | 6/1991 | Kim et al. . |
| 5,125,983 | * | 6/1992 | Cummings ........................ 136/246 |
| 5,246,506 | | 9/1993 | Arya et al. . |
| 5,460,659 | * | 10/1995 | Krut ................................. 136/246 |
| 5,466,302 | | 11/1995 | Carey et al. . |
| 5,620,528 | | 4/1997 | Schade et al. . |
| 5,922,142 | | 7/1999 | Wu et al. . |
| 5,928,437 | | 7/1999 | Dillard et al. . |
| 5,951,786 | * | 9/1999 | Gee et al. ......................... 136/256 |
| 5,961,737 | | 10/1999 | Glenn et al. . |
| 5,963,790 | | 10/1999 | Matsuno et al. . |
| 6,130,465 | * | 10/2000 | Cole ................................. 257/431 |

* cited by examiner

*Primary Examiner*—Alan Diamond
(74) *Attorney, Agent, or Firm*—Katten Muchin Zavis (57) ABSTRACT

A simplified method and system for interconnecting solar cell arrays which does not utilize cause damage to the solar cells while at the same time minimizing process steps. In particular, in accordance with the present invention, interconnection between solar cell are made by way of a conductive epoxy, patterned on a substrate. The use of the epoxy eliminates the need for wire bonding as well as eliminates additional processing steps to interconnect the solar cell arrays.

12 Claims, 9 Drawing Sheets

WIRELESS SOLAR CELL ARRAY ELECTRICAL INTERCONNECTION SCHEME

BACKGROUND OF THE INVENTION

1. Field of the Invention

The present invention relates to solar cells and more particularly and process for interconnecting solar cell arrays in which the interconnections are made by way of a conductive epoxy patterned on the substrate which eliminates the need for wire bonding directly to the solar cells in order to minimize damage to the solar cells and reduce the cost for forming solar cell arrays.

2. Description of the Prior Art

Solar cells are known to be used in various applications for converting light energy to electrical energy. In fact, solar cell arrays are known to be used as the primary power source in space craft applications due to their self-generating the power by charging from sunlight. However, due to the relatively low energy output of such solar cells, a plurality of solar cells are formed in an array which, in turn, are interconnected with a relatively large number of additional solar cell arrays to form a solar panel that is capable of generating in an electrical power, for example to power a spacecraft.

A typical solar cell array module is about 6"×12"×3 mils. Typical solar cell panels can be as large as 14 feet×42 feet. Thus, a significant number of solar array modules must be interconnected to form a solar cell panel. In particular, individual solar cells are connected in series to provide a desired output voltage. The series blocks of solar cells in turn are connected in parallel to provide sufficient current output for the particular application.

Solar cells (also known as photo-voltaic cells) are known to be formed from semiconductor processing techniques. Such solar cells are typically formed as thin films on a substrate, typically 3 to 250 mils in thickness. Electrical contact pads are formed on the solar cells in order to enable the cell to be interconnected with other cells to form a solar cell array. Examples of solar cells are disclosed in U.S. Pat. Nos. 5,246,506; 4,892,592; 4,348,254; 4,240,842; 4,392,010; 5,963,790; 5,922,142 and 5,928,437, all hereby incorporated by reference.

Various techniques are known for interconnecting the solar cells to form solar cell arrays. Examples of such techniques are disclosed in U.S. Pat. Nos. 5,006,179; 5,011,544; 5,961,737; 5,620,528 and 5,021,099. However, there are problems with such techniques for interconnecting solar cells. In particular, U.S. Pat. Nos. 5,006,179; 5,961,737 and 5,620,528 disclosed interconnecting solar cells to form solar cell arrays by wire bonding electrical conductors to the wire bond pads on the solar cells. Such wire bonding is known to raise the temperature of the wire bond pads to 200° C. or better which can cause damage to the solar cells. In addition, wire bonding techniques are known to result in short p-n junction of the solar cells due to the pressure from the wire bonder. Accordingly, alternate techniques for interconnecting solar cells have been developed. Examples of such alternate techniques are disclosed in U.S. Pat. Nos. 5,021,099 and 5,466,302, hereby incorporated by reference.

The '099 patent discloses an interconnection system in which the solar cells are interconnected by way of an interconnect circuit formed on a flexible dielectric substrate, disposed on the back side of the solar cell. The interconnection circuit is adapted to be used with solar cells having front mounted wire bonding pads. The interconnection circuit is formed with a plurality of vertically extending figures which extend in the direction generally perpendicular to the plane of the solar cell. The extending figures are disposed adjacent the edges of the solar cell and are bent to make electrical contact with the wire bond pads on the top side of the solar cell. Such a system, however, involves rather complicated processing techniques and can result in non-uniform contact pressure between the contact fingers and the wire bond pads on the solar cell, thus degrading the power output of the solar cell.

The '302 patent solves these problems by utilizing a electrically conductive paste in order to connect copper strips to the wire bond pads on the solar cell. Although the process disclosed in the '302 patent eliminates problems associated with soldering and solar cell degradation, the process disclosed by the '302 patent is relatively expensive and requires the formation of the copper strips for the interconnection.

Figure 1A:
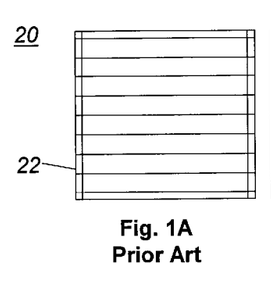
FIG. 1A is a plan view of the glass side of a conventional solar array.
Figure 1B:
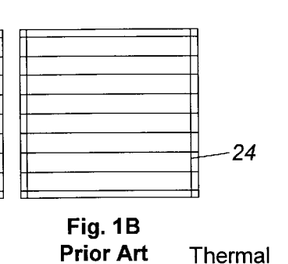
FIG. 1B is a plan view of the opposing or metal side of the solar cell array illustrated in FIG. 1A.
Figure 2A:
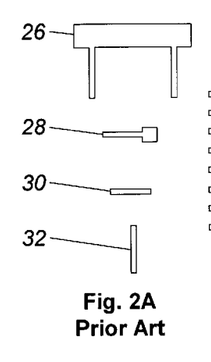
FIG. 2A illustrates a number of conventional ribbon conductors.
Figure 2B:
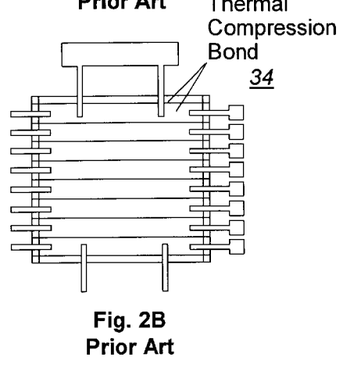
FIG. 2B illustrates the ribbon conductors illustrated in FIG. 2A attached to the metal side of the solar cell array illustrated in FIG. 1B forming a solar cell assembly.
Figure 3:
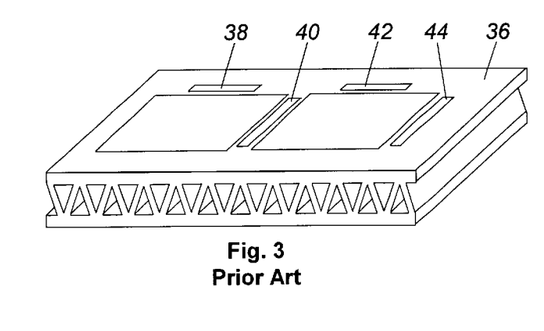
FIG. 3 illustrates a conventional aluminum hollow foil panel carrier, with a thermal (non electrically conductive epoxy) applied thereto to form a plurality of interconnection pads.
Figure 4:
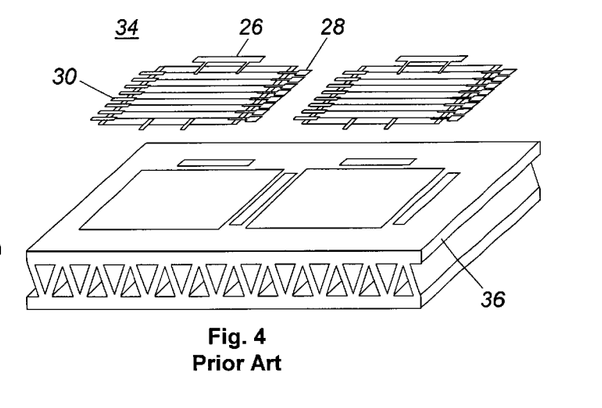
FIG. 4 illustrates the solar cell assemblies illustrated on FIG. 2B aligned with the carrier illustrated in FIG. 3.
Figure 5:
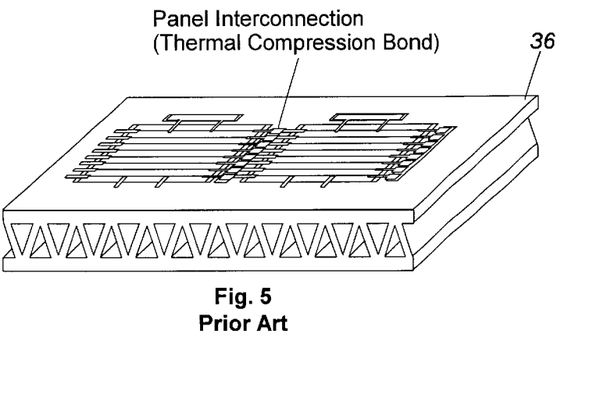
FIG. 5 illustrates the assembly of the solar cell assemblies to the aluminum hollow foil panel carrier.

As mentioned above, groups of solar cell arrays modules are interconnected to form solar panels. In order to avoid the interconnection problems discussed above, thermal compression bonding techniques have been developed for interconnecting solar cell arrays to form a solar cell panel. An example of such a technique is illustrated in FIGS. 1–5. Referring to FIGS. 1A and 1B, a conventional solar cell array is shown. In particular, a front or glass side 22 is illustrated in FIG. 1A, while a back or metal side 24 is illustrated in FIG. 1B. As shown in FIGS. 2A and 2B, various electrical ribbon conductors, identified with the reference numerals 26, 28, 30 and 32, are connected to the metal side 24 of the solar cell by conventional thermal compression bonding to form a solar cell assembly 34. The solar cell assembly 34 is assembled to a substrate 36, such as an aluminum hollow foil panel carrier, as illustrated in FIG. 3. A thermally conductive (but not electrically conductive) epoxy is patterned on the carrier 36 to form a number of interconnection pads 38, 40, 42, and 44 on the substrate 36. Subsequently, as illustrated in FIG. 4, the ribbon conductors 26, 28 and 30 on the solar cell assemblies 34 are aligned with the interconnection pads 38, 40, 42 and 44 on the carrier 36. As shown in FIG. 5, the solar cell assembly 34 is disposed on the carrier 36 with the electrical ribbon conductors 26–32 aligned with the interconnection pads 38–44 and secured thereto by thermal compression by way of a wire bonder. Unfortunately the wire bonder is in contact with the solar cells 20 during this process. The pressure from the wire bonder is known to short out the solar cells. Thus there is a need for a simplified method for interconnecting solar cell arrays which does not damage the solar cells.

SUMMARY OF THE INVENTION

The present invention relates to a simplified method and system for interconnecting solar cell arrays which does not utilize cause damage to the solar cells while at the same time minimizing process steps. In particular, in accordance with the present invention, interconnection between solar cell are made by way of a conductive and thermal epoxy (non-electrical epoxy) epoxy, patterned on a substrate. The use of the epoxy eliminates the need for wire bonding and isolates the individual cell from electrical shortage, as well as eliminates additional processing steps to interconnect the solar cell arrays.

DESCRIPTION OF THE DRAWINGS

These and other advantages of the present invention will be readily understood with reference to the following specification and attached drawings wherein.

DETAILED DESCRIPTION

The present invention relates to a relatively simple and effective method for interconnecting solar cell arrays which does not utilize wire bonding. By eliminating the need for wire bonding for interconnecting solar cell arrays, damage to solar cells as a result of a wire bonding process is virtually non-existent. In addition, interconnection of the solar cells is rather simpler and easier and involves less processing steps, for example, than known interconnection techniques, for example as disclosed in U.S. Pat. No. 5,466,302. By reducing the number of processing steps and materials required, the system and method for interconnecting the solar cells in accordance with the present invention is relatively easier to manufacture and thus less expensive.

Three embodiments of the invention are described and illustrated. One embodiment is illustrated in FIGS. 7A–7H which involves forming a thick film interconnection pattern on a substrate, such as an aluminum hollow foil panel carrier, and interconnecting the solar cell bond pads to the electrical interconnection pattern by way of an electrically conductive epoxy. An alternate embodiment of the invention is illustrated in FIGS. 8A–8H which involves forming an interconnection pattern on a printed circuit board by film screening techniques. Another alternate embodiment is illustrated in FIGS. 9A–9C involves etching the copper on a printed circuit board to form an interconnection pattern and interconnecting the solar cells to the interconnection pattern by way of a conductive epoxy. All three embodiments in accordance with the present invention enable interconnections between solar cell arrays to form a solar cell panel.

Figure 6:
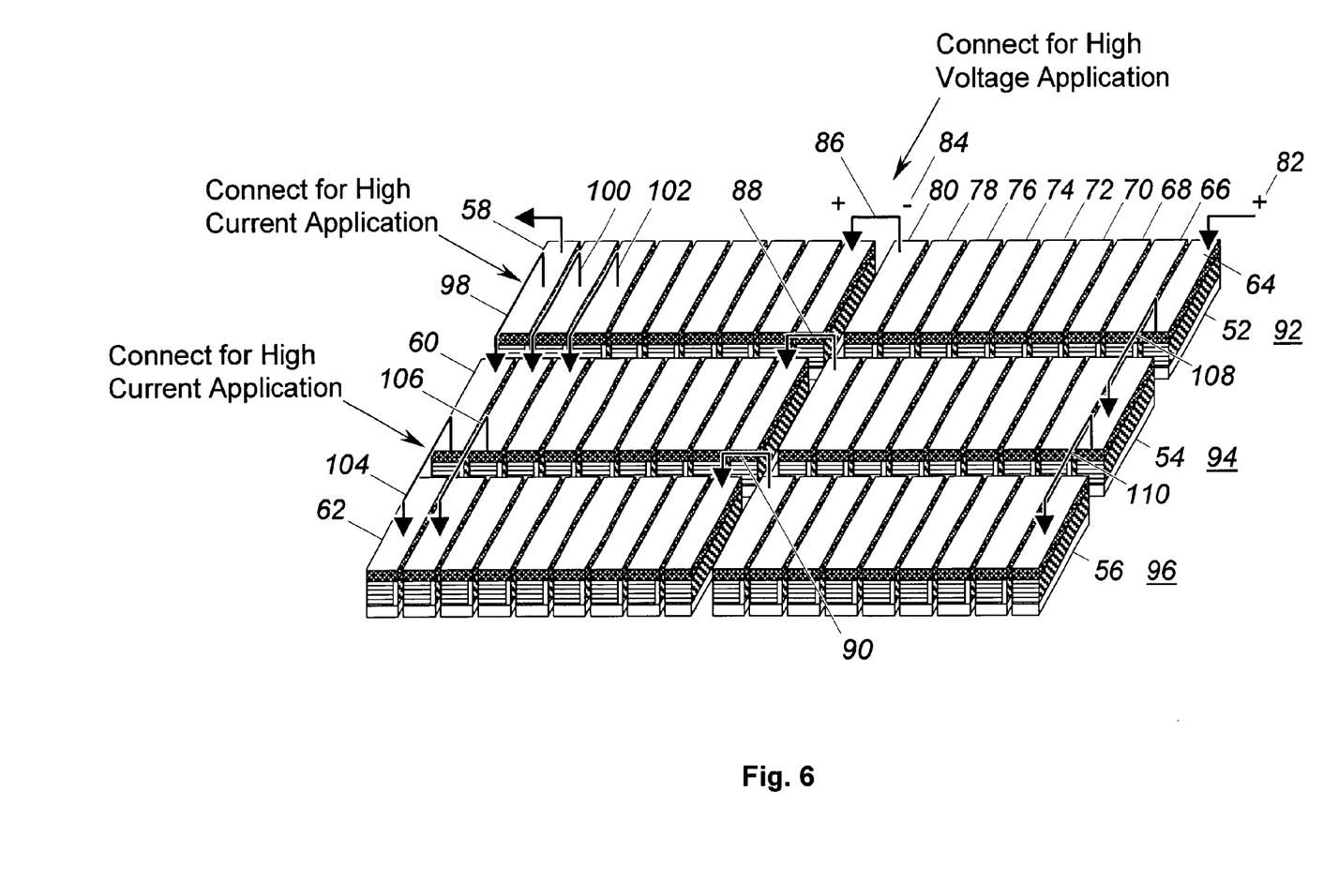
FIG. 6 the schematic diagram illustrating the interconnection of solar cell arrays.

Referring to FIG. 6, an exemplary solar panel is illustrated and generally identified with the reference numeral 50. The solar panel 50 is shown with an exemplary number of solar cell arrays 52, 54, 56, 58, 60 and 62. Each solar cell array 52, 54, 56, 58, 60 and 62 is formed from an exemplary number of solar cells 64, 66, 68, 70, 72, 74, 76, 78 and 80.

Various techniques are known for interconnecting individual solar cells, for example, as disclosed in U.S. Pat. Nos. 5,011,544; 5,620,528; 5,961,737; 5,006,179; 5,021,099; 5,466,302 to form a solar cell array, for example, as disclosed in U.S. Pat. Nos. 4,892,592 and 5,928,437, all hereby incorporated by reference. In general, the individual solar cells 64–80 are connected in series to form the solar cell arrays 52–62. External connections to the solar cell arrays 52–62 are by way of electrical contacts. In particular, each solar cell array 52–62, is provided with a positive polarity contact, generally identified with the reference numeral 82, and a negative polarity contact, generally identified with the reference numeral 84. As shown in FIG. 6, multiple solar cell arrays 52–62 often need to be connected in series for high voltage applications. Thus, as shown, the solar cell pairs 52/58; 54/60 and 56/62 are shown schematically connected in the series, represented by the arrows 86, 88 and 90 to form banks of solar cell arrays. 92, 94 and 96. In relatively high current applications, multiple solar cell array banks 92, 94 and 96 are connected in parallel. These parallel connections are represented by the arrows 98, 100, 102, 104, 106, 108 and 110.

Figure 7A:
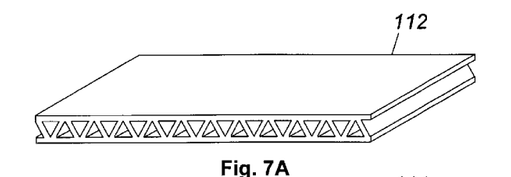
FIGS. 7A–7H illustrate the process for interconnecting the solar cell arrays in accordance with the present invention.
Figure 7B:
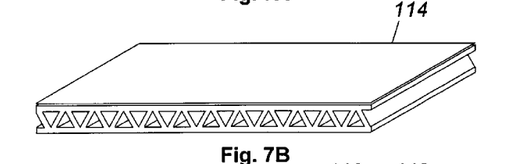
Figure 7C:
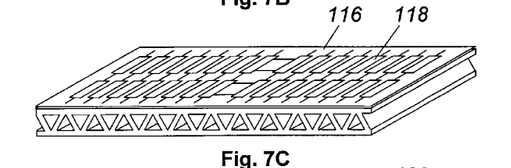
Figure 7D:
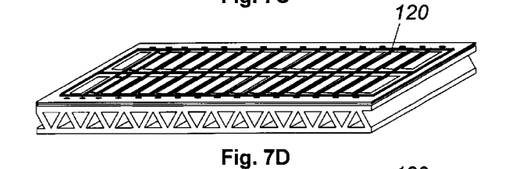
Figure 7E:
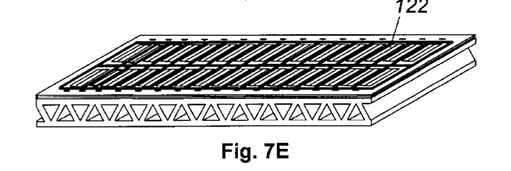
Figure 7F:
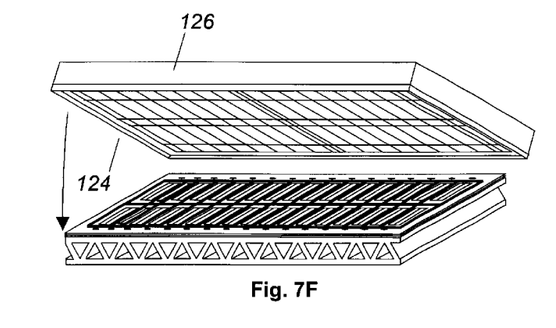
Figure 7G:
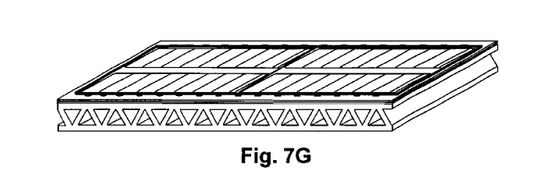
Figure 7H:
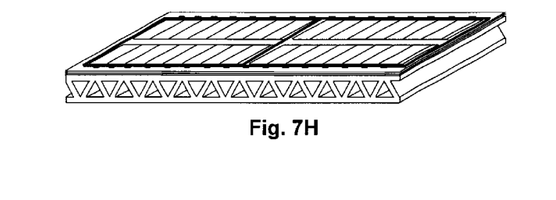

Referring to FIGS. 7A–7H, a process for interconnecting solar cell arrays in accordance with the present invention is illustrated. Initially, as illustrated in FIG. 7A, a carrier 112, such as, an aluminum hollow foil panel carrier, is provided. The carrier 112 is coated with a thermally conductive non-electrically conductive epoxy 114, such as Ablestik 84-3, as shown in FIG. 7B. Other thermally conductive epoxies are also suitable; however, the selected epoxy should have a thermal expansion characteristic similar to the thermal expansion characteristic of the glass on the solar cell. As shown in FIG. 7C, a thick film electrical interconnection pattern 116 is printed on top of the epoxy 114 by industrial standard thick film processing techniques. The interconnection pattern 116 is formed as generally shown in FIG. 7C and includes a plurality of spaced apart interconnective rectangular conductors 118. The areas outside of the rectangular conductive areas 118 define isolation areas while the area within the conductive pattern conductive rectangles 118 form conductive areas. After the interconnection pattern 116 is formed, a mask (not shown) is used to pattern the non-conductive areas. A non-electrically but thermally conductive epoxy 120, for example, Loctite® 3536 or equivalent is injected in the isolation areas as generally shown in FIG. 7D. Subsequently, a mask (not shown) is used to pattern a conductive areas within the conductive rectangles 118. An electrically conductive epoxy 122, for example Ablestik® 965-1L or equivalent is injected into the conductive areas as generally shown in FIG. 7E. After the thermally conductive epoxy 120 and electrically conductive epoxy 122 are disposed in the isolation and conductive areas, a solar cell panel, generally identified with the reference numeral 24, which consists of a plurality of solar cell arrays, is loaded into a vacuum disk, generally identified with the reference number 126. An exemplary vacuum disk for receiving multiple solar cell panels is disclosed in U.S. patent application Ser. No. 09/316,991. The vacuum disk 126 is preferably adapted for multiple solar cell panels with mesa patterns for alignment and epoxy high control. As shown in FIG. 7F, the vacuum disk loaded with the solar cell panels is aligned with the carrier 112 and pressed against the carrier 112. The epoxy is allowed to cure. As shown in step 7G, the vacuum chuck is removed leaving a solar cell panel with a plurality of interconnected solar cell arrays. Lastly, as shown in FIG. 7H, a non-electrical epoxy, such as Loctite® 3565 or equivalent may be applied along the joint therebetween to secure the solar cell panels to the carrier 112.

Figure 8A:
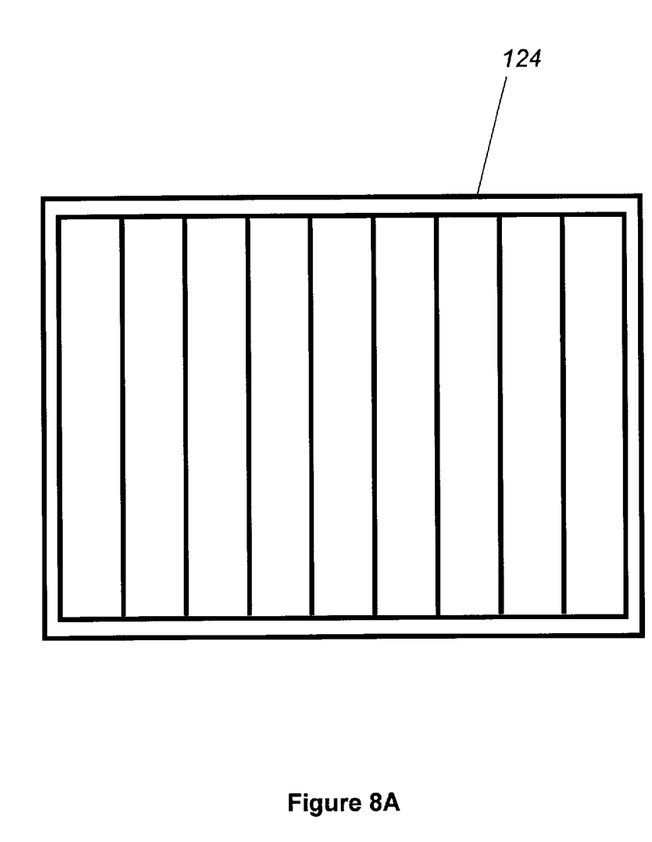
FIGS. 8A–8H illustrate an alternate embodiment of the invention utilizing thick film screening on a printed circuit board for interconnection.
Figure 8B:
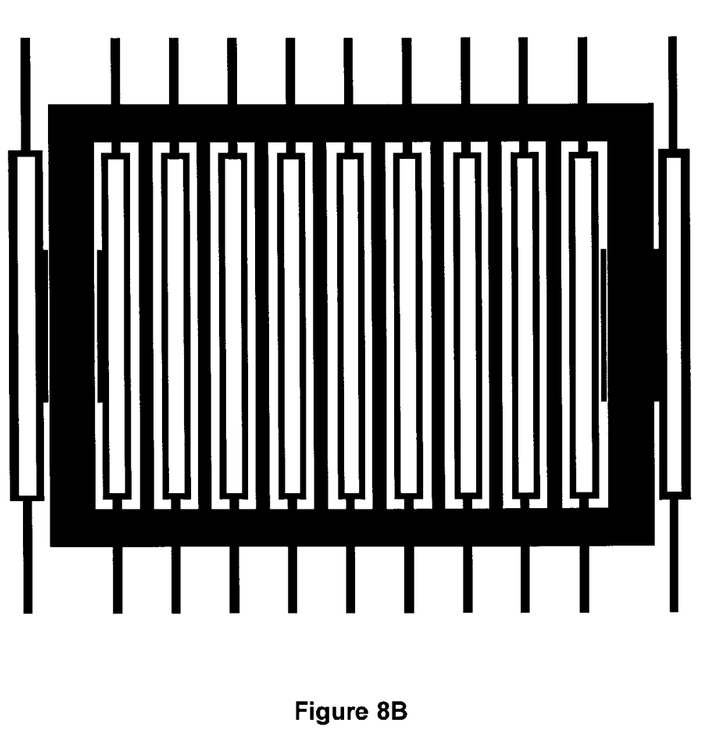
Figure 8C:
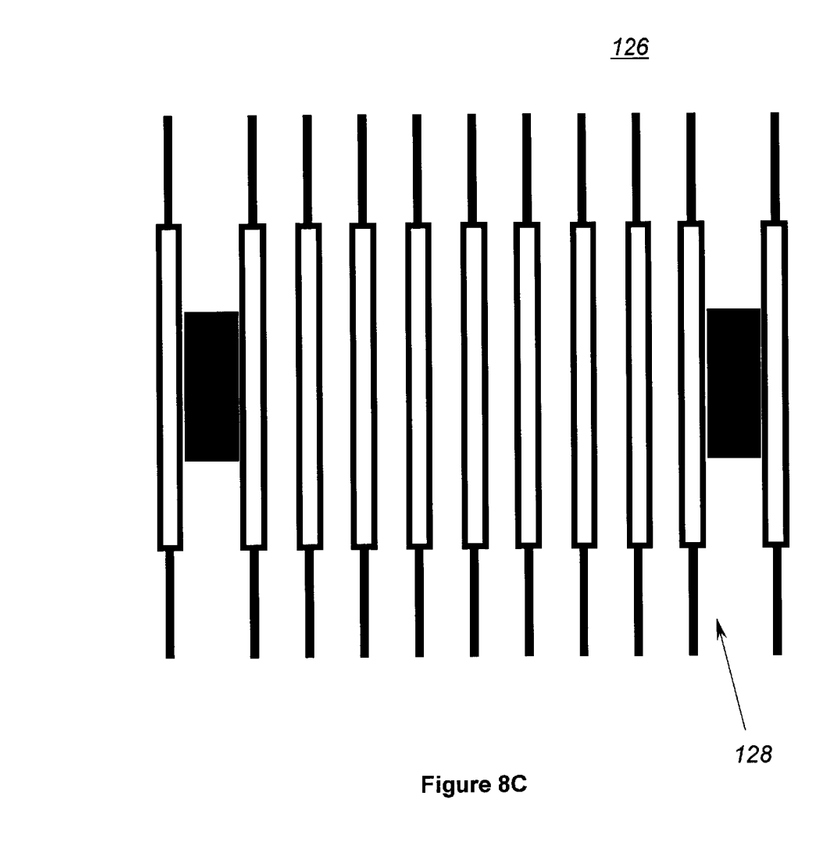
Figure 8D:
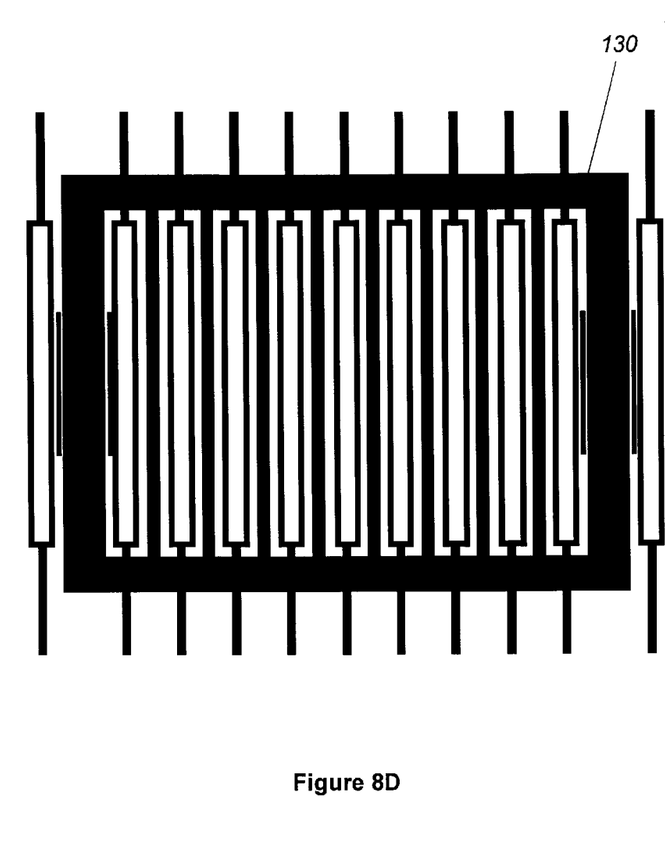
Figure 8E:
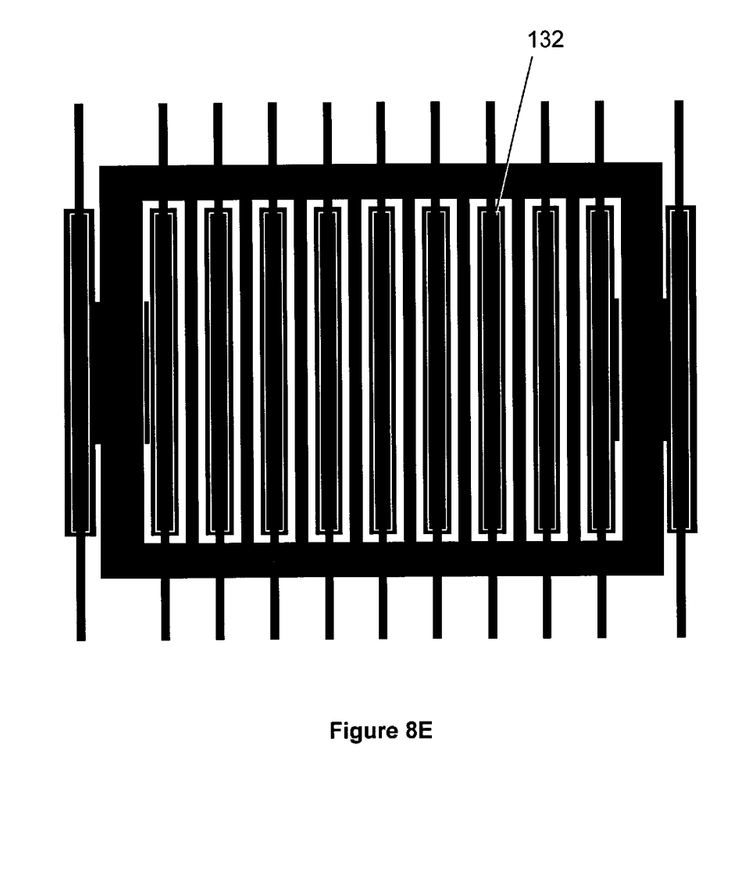
Figure 8F:
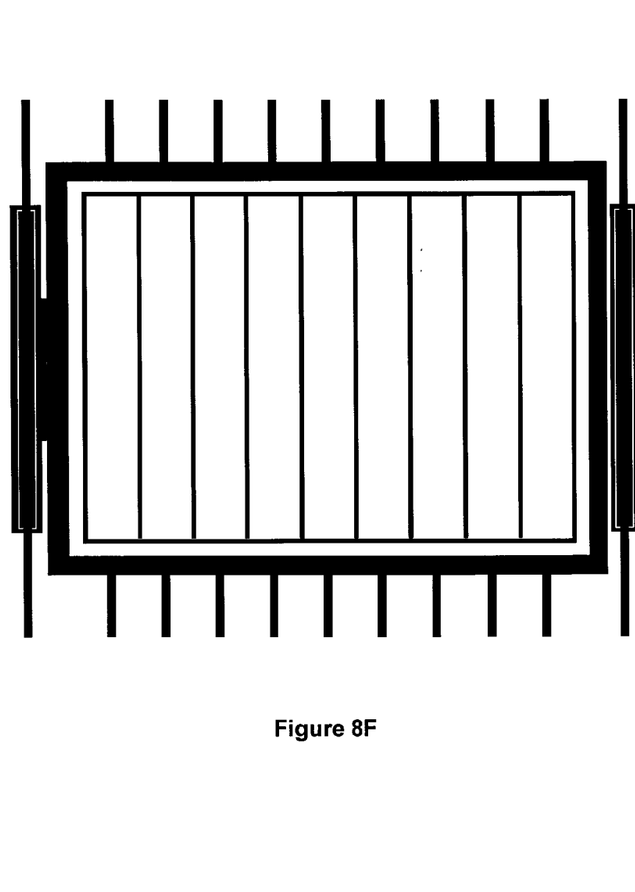
Figure 8G:
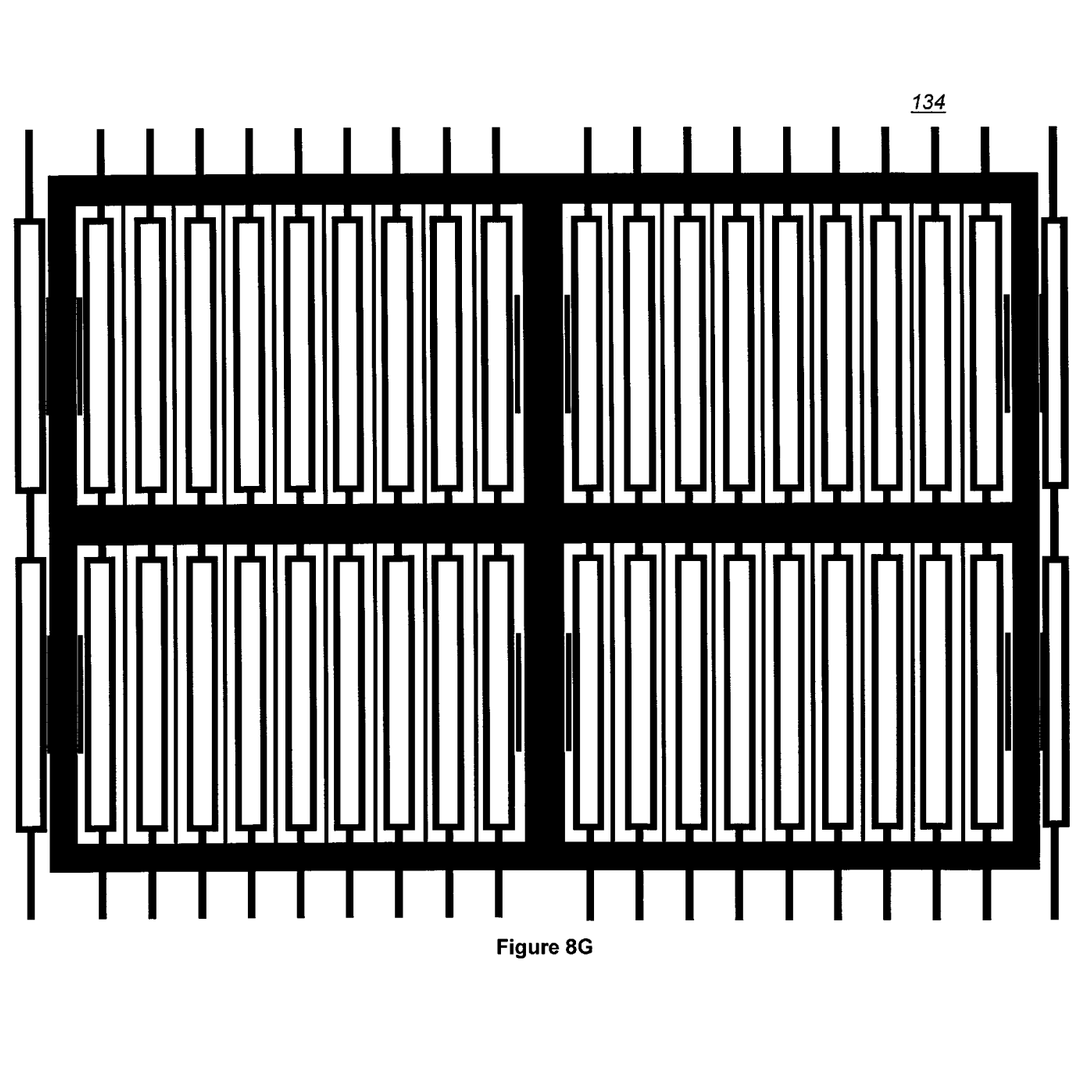
Figure 8H:
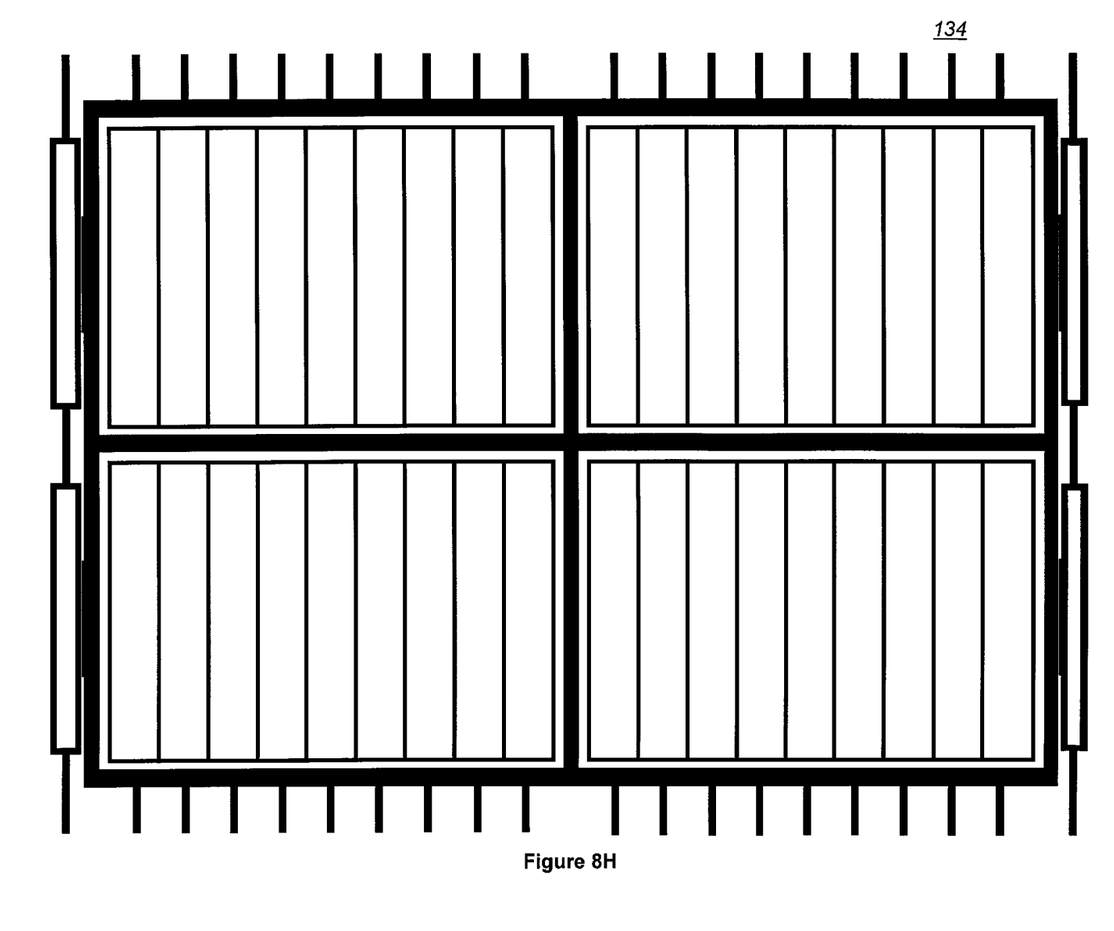
Figure 9A:
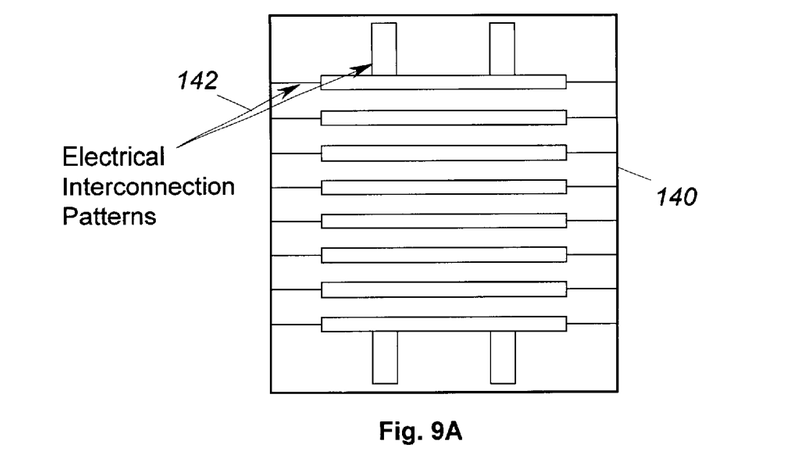
FIGS. 9A–9C illustrate on another alternate embodiment of the invention utilizing an etching printed circuit board for interconnection.
Figure 9B:
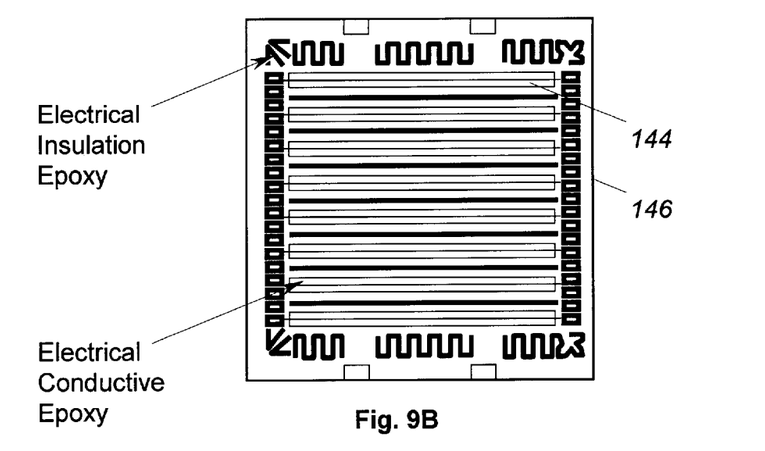
Figure 9C:
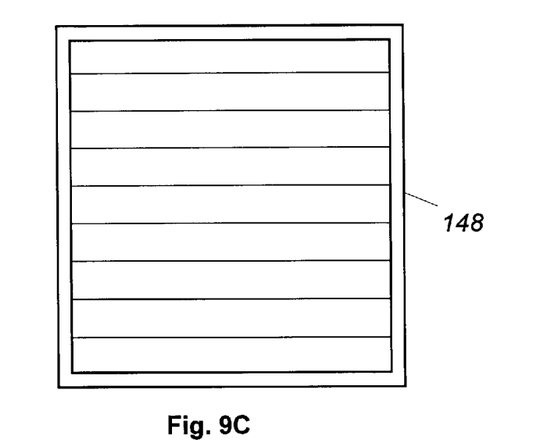

An alternative embodiment of the invention is illustrated in FIGS. 8A–8H. In this embodiment, a printed circuit board is used instead of a non-electrically conductive coating, for example, Rogers Duroid 6002 or equivalent on a hollow aluminum foil carrier as discussed above. In this embodiment, a solar cell 124, for example, as illustrated in FIG. 8A, is adapted to be electrically interconnected with other solar cell arrays by way of interconnection PC board 126 illustrated in FIG. 8B. The process for forming the solar cell interconnection PC board 126 is illustrated in FIGS. 8C–8F. FIGS. 8G–8H illustrate the principle of an interconnection PC board for interconnecting multiple solar cell arrays.

Referring to FIG. 8A, the solar cell array 124 is a conventional solar cell array, for example, as supplied by Solarex Corporation of Rockfield, Md. The interconnection PC board 126 is formed by known thick film screen printing techniques, as discussed above. In particular, referring to FIG. 8C, initially an electrically conductive epoxy, for example, Ablebond® 965-1L or 84-1LMI, is screen printed on the PC board to form a conductive pattern 128 as shown. Subsequently, an isolation area 130 is screen printed on top of the conductive pattern as generally shown in FIG. 8D. As shown in FIG. 8E, the interconnection patterned formed with the conductive epoxy is formed with a number of rectangles, generally identified with the reference numeral 132 forming conductive areas. These conductive areas 132 are filled with the conductive epoxy as generally shown in FIG. 8E. Subsequently, the solar cell 124 is placed on the PC board as shown in FIG. 8F. As shown in FIG. 8F, the conductive pattern 128 facilitates connections between solar cell arrays without the need for wire bonding.

The process illustrated in FIGS. 8C–8F may be used to form a solar panel using an interconnection PC board 134. In particular the interconnection PC board 134 is used to interconnect a plurality of solar cell arrays and facilitate connections of those arrays to other solar cell arrays. FIG. 8H illustrates an assembly of multiple solar cell arrays disposed on a PC board 134.

Alternatively, as shown in FIGS. 9A–9C the copper in a PC board may be etched in lieu of thick film screening. With reference to FIG. 9A, a PC board 140 may be masked, by a mask (not shown) to form an interconnection pattern 142, generally identified with the reference numeral 142. The printed circuit board 140 is etched by known techniques to expose the copper and to form the conductive pattern 142 and in particular generally rectangular electrically conductive areas 144 and non-conductive areas 146. The electrically conductive areas 144 may be filed with an electrically conductive epoxy, for example, Ablestik® 965-1L or equivalent as shown in FIG. 8B, while the non-conductive areas 146 are injected with a thermally conductive non electrically conductive epoxy, for example, Loctite® 3565 or equivalent as generally shown in FIG. 9B. As shown in FIG. 9C, a solar cell array 148 aligned with the PC board 140 and placed thereon utilizing a vacuum disk as discussed above.

Obviously, many modifications and variations of the present intention are possible in light of the above teachings. Thus, it is to be understood that, within the scope of the appended claims, the invention may be practiced otherwise than as specifically described above.

What is claimed and desired to be secured by Letters Patent of the United States is:

1. A method for interconnecting solar cell arrays having electrical contacts for interconnection to form a solar cell panel, the method comprising the steps of:

(a) providing a substrate:

(b) forming an interconnection pattern of electrically conductive areas and non-electrically conductive areas on said substrate;

(c) applying an electrically conductive epoxy on said electrically conductive areas of said interconnection pattern;

(d) aligning said electrical contacts on one or more of said solar arrays with said electrical conductive areas on said interconnection pattern formed on said substrate; and (e) disposing said solar cell arrays on said substrate such that said electrical contacts are in contact with said electrically conductive areas of said interconnection pattern forming an assembly, defining a joint between said substrate and said one or more solar cell arrays, wherein said substrate is an aluminum hollow foil panel carrier.

2. The method as recited in claim 1, wherein said interconnection pattern is formed by coating said substrate with a first non-electrically conductive epoxy and forming said interconnection pattern by thick film printing techniques.

3. The method as recited in claim 2, wherein a second non-electrically conductive epoxy is disposed on said non-electrically conductive areas.

4. The method as recited in claim 3, wherein said first and second non-electrically conductive epoxies are thermally conductive.

5. The method as recite in claim 4, wherein said first and second non-electrically conductive epoxies are selected such that their thermal expansion characteristic is similar to the thermal expansion characteristics of the solar cell array.

6. A method for interconnecting solar cell arrays having electrical contacts for interconnection to form a solar cell panel, the method comprising the steps of:

(a) providing a substrate;

(b) forming an interconnection pattern of electrically conductive areas and non-electrically conductive areas on said substrate;

(c) applying an electrically conductive epoxy on said electrically conductive areas of said interconnection pattern;

(d) aligning said electrical contacts on one more of said solar cell arrays with said electrical conductive areas on said interconnection pattern formed on said substrate; and (e) disposing said solar cell arrays on said substrate such that said electrical contacts are in contact with said electrically conductive areas of said interconnection pattern forming an assembly, defining a joint between said substrate and said one or more solar cell arrays, wherein a non-electrically conductive epoxy is disposed along said joint to secure said one or more solar cell panels to said substrate.

7. A method for interconnecting solar cell arrays having electrical contacts for interconnection to form a solar cell panel, the method comprising the steps of:

(a) providing a substrate;

(b) forming an interconnection pattern of electrically conductive areas and non-electrically conductive areas on said substrate;

(c) applying an electrically conductive epoxy on said electrically conductive areas of said interconnection pattern;

(d) aligning said electrical contacts on one or more of said solar cell arrays with said electrical conductive areas on said interconnection pattern formed on said substrate; and (e) disposing said solar cell arrays on said substrate such that said electrical contacts are in contact with said electrically conductive areas of said interconnection pattern forming an assembly, defining a joint between said substrate and said one or more solar cell arrays, wherein said substrate is a printed circuit board and said interconnection pattern is formed on said printed circuit board with an electrically conductive epoxy and wherein a non-electrically conductive epoxy is applied over said interconnection pattern to form the non-electrically conductive areas.

8. The method as recited in claim 7, wherein said non-electrically conductive epoxy is thermally conductive.

9. The method as recited in claim 7, wherein said printed circuit board includes a non-conductive layer formed over a conductive copper layer and wherein said interconnection pattern is formed by etching the copper layer in the printed circuit board.

10. A solar panel comprising:

one or more solar cell arrays, each array having a positive polarity electrical contact and a negative polarity electrical contact;

a substrate having an interconnection pattern thereon defining conductive areas and non conductive areas; and an electrically conductive epoxy for bonding said positive and negative polarity contacts to said conductive areas; and a non-electrically conductive epoxy between said one or more solar cell arrays and said non-conductive areas on said substrate.

11. The solar panel as recited in claim 10, wherein said non-electrically conductive epoxy is a thermally conductive epoxy.

12. The solar panel as recited in claim 10, wherein said substrate is a hollow foil aluminum carrier.

* * * * *